United States Patent [19]

Samukawa

[11] Patent Number: 5,468,341
[45] Date of Patent: Nov. 21, 1995

[54] PLASMA-ETCHING METHOD AND APPARATUS THEREFOR

[75] Inventor: Seiji Samukawa, Tokyo, Japan

[73] Assignee: NEC Corporation, Tokyo, Japan

[21] Appl. No.: 219,177

[22] Filed: Mar. 28, 1994

[30] Foreign Application Priority Data

Dec. 28, 1993 [JP] Japan .................... 5-334488

[51] Int. Cl.$^6$ .................................... H05H 1/00
[52] U.S. Cl. .............. 216/69; 156/345; 204/298.37; 204/298.38
[58] Field of Search ............... 156/643, 646, 156/345; 118/723 MW, 723 ME, 723 MR, 723 MA, 723 AN; 204/192.32, 298.37, 298.38

[56] References Cited

U.S. PATENT DOCUMENTS

| | | | |
|---|---|---|---|
| 4,808,258 | 2/1989 | Otsubo et al. | 156/643 |
| 4,891,118 | 1/1990 | Ooiwa et al. | 156/345 X |
| 5,013,401 | 5/1991 | Samukawa et al. | 156/643 |
| 5,034,086 | 7/1991 | Sato | 156/345 |
| 5,160,397 | 11/1992 | Doki et al. | 156/345 |
| 5,231,057 | 7/1993 | Doki et al. | 437/225 |
| 5,273,609 | 12/1993 | Moslehi | 156/345 |

FOREIGN PATENT DOCUMENTS

| | | |
|---|---|---|
| 56-13480 | 2/1981 | Japan . |
| 56-155535 | 12/1981 | Japan . |
| 60-120525 | 6/1985 | Japan . |
| 60-134423 | 7/1985 | Japan . |

*Primary Examiner*—Thi Dang
*Attorney, Agent, or Firm*—Popham, Haik, Schnobrich & Kaufman, Ltd.

[57] ABSTRACT

A plasma-etching method and an apparatus therefor are provided, in which microwaves are introduced and a high frequency electric fields generated thereby is pulse-modulated by a signal of a frequency higher than about 10 kHz for producing the plasmas for etching a wafer. The pulse modulation of the high frequency electric fields may be performed with a pulse interval time shorter than about 10 μs. The radical production ratio in ECR plasmas, ion temperature and charge accumulation can be controlled thereby enabling the etching performance at a high precision.

5 Claims, 6 Drawing Sheets

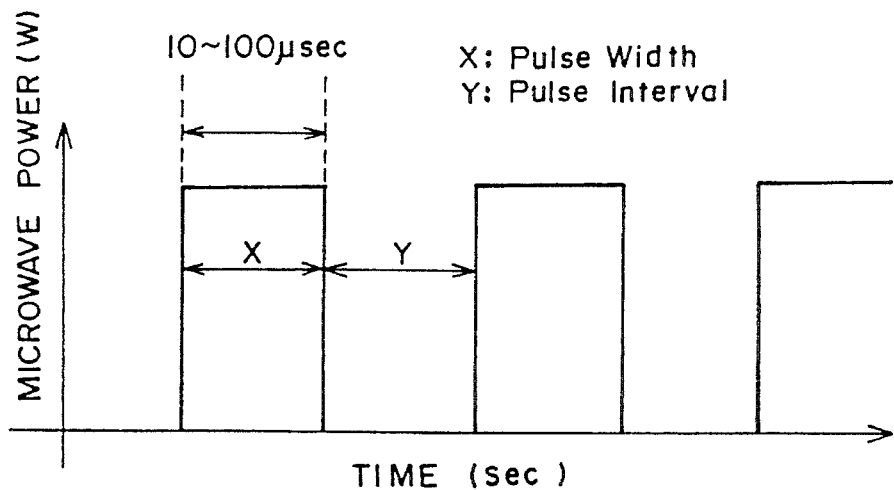
FIG. 4
FIG. 5
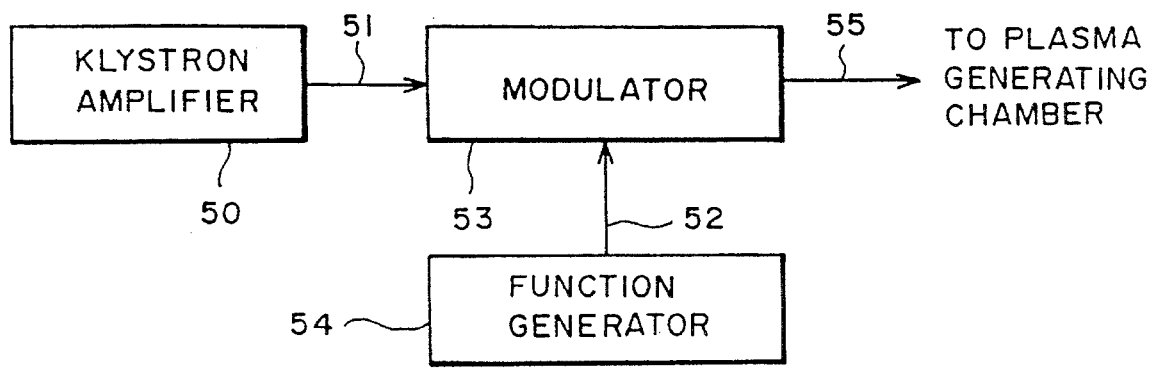

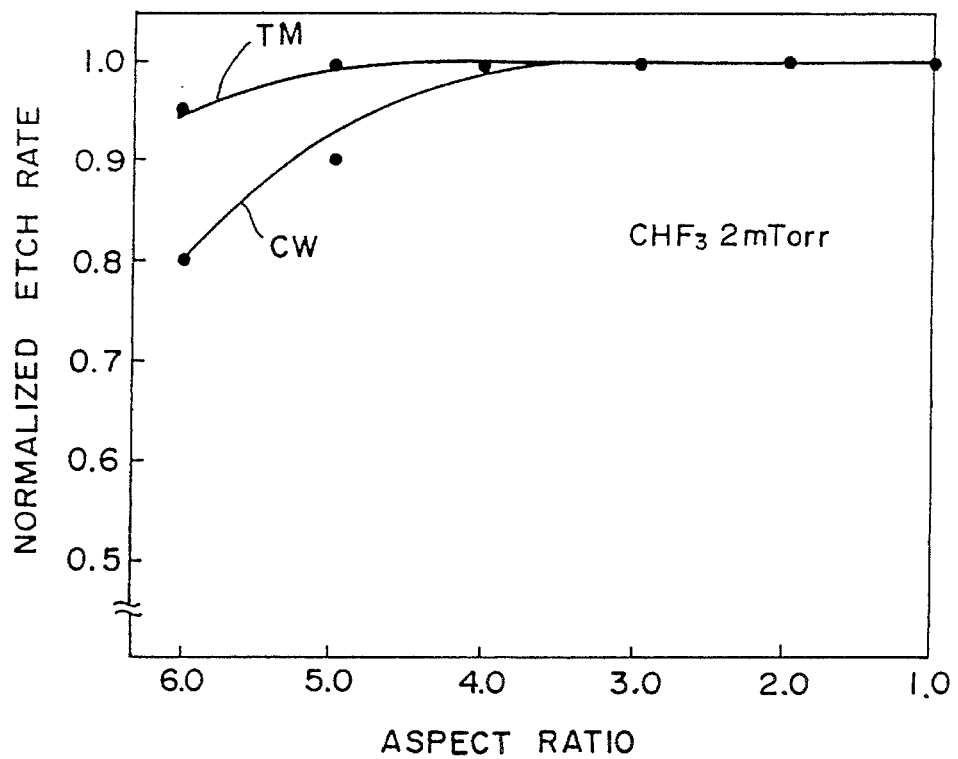
FIG. 10
FIG. 11
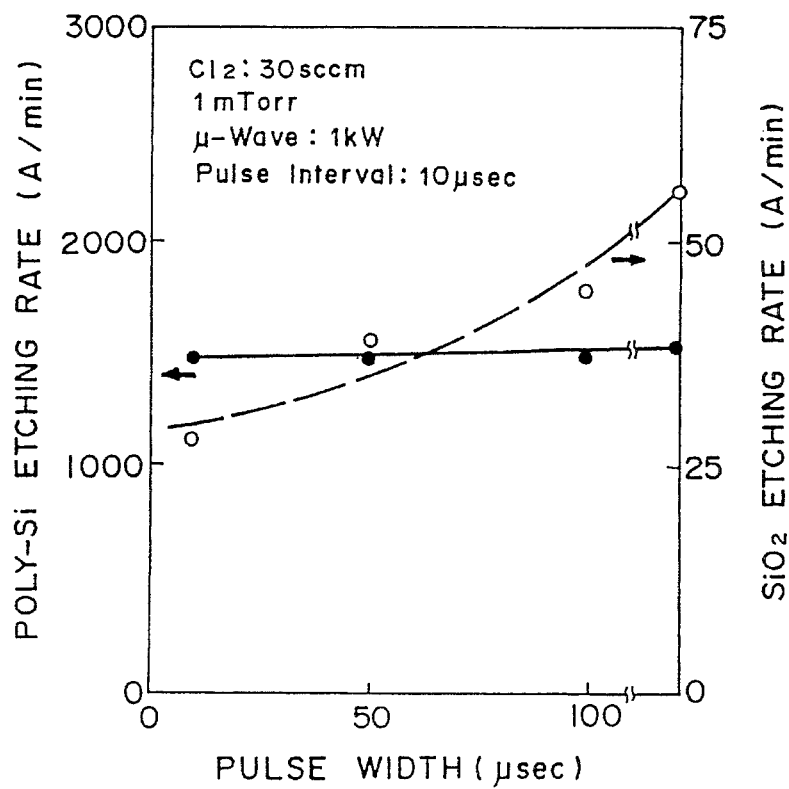

PLASMA-ETCHING METHOD AND APPARATUS THEREFOR

BACKGROUND OF THE INVENTION (1) Field of the Invention

The present invention relates to a method and an apparatus for plasma-etching, and more particularly to a method and an apparatus for etching surfaces of an object such as a semiconductor wafer with plasmas produced by utilizing a high frequency electric field.

(2) Description of the Related Art

As conventional plasma-etching apparatuses of the kind to which the present invention relates, two examples can be referred to for reference.

The first example which is an etching apparatus as shown in FIG. 1 has been disclosed in Japanese Patent Application Kokai Publication No. Sho 56-155535. In this apparatus, an object 101 to be etched is set on a table (wafer holder) 102 in a plasma generation chamber 103 so that it is placed in tile electron cyclotron resonance discharges caused by microwaves 104 and is subjected to an etching process. In the drawings, numeral 105 denotes a gas inlet duct, 108 denotes a magnetic coil, 109 denotes microwave inlet window, 110 denotes a waveguide, and 114 denotes an electron cyclotron resonance point.

The second example which is an etching apparatus as shown in FIG. 2 has been disclosed in Japanese Patent Application Kokai Publication No. Sho 60-134423. In this etching apparatus, a reaction gas is introduced into a plasma generation chamber 203 through a gas inlet duct 205. A reactive gas plasma is so produced in the plasma generation chamber 203 that both the microwaves generated by a microwave source (for example, a magnetron) 207 and the magnetic fields generated by magnetic coils 208 act on the introduced reaction gas. The reactive gas plasma thus produced is introduced through a port 212 into a reaction chamber 200 below the plasma generation chamber 203, where a wafer (object) 201 to be etched is placed on a table 202, by utilizing the divergent magnetic fields generated by the magnetic coils 208. In the drawings, numeral 210 denotes a waveguide, numeral 209 denotes a microwave inlet window through which the microwaves generated by the microwave source 207 are introduced into the plasma generation chamber 203, and 215 denotes an electron cyclotron resonance point.

However, there have been problems in the conventional apparatuses as described above in that, although the control of ion energy reaching a surface of the object to be etched is possible by controlling the power of RF waves, the controllable range of dissociation process in plasmas is narrow and, therefore, the extent of controllable etching reactions on the surface of the object wafer is narrowly limited. Also, since the magnetic fields are present in the plasma generation chamber 203 for high density plasmas, there inevitably occurs a magnetohydrodynamic plasma instability due to, for example, drift waves generated in the plasmas, which leads to a problem wherein the ion temperature rises and the directions of ion motions become nonuniform. Further, the problems include a degradation of a gate oxide film and a distortion of etching profile due to the charges accumulated on the wafer.

SUMMARY OF THE INVENTION

It is, therefore, an object of the present invention to overcome the problems existing in the prior art and to provide an improved plasma-etching method and apparatus which realize a high precision etching by controlling a dissociation reaction in plasmas, an instability in the plasma, and a time dependency characteristic of the accumulated charges on a wafer.

According to one aspect of the invention, there is provided a plasma-etching method for etching a surface of an object by directing reaction gas plasmas excited by high frequency electric fields to impinge on the object thereby to impact nonmasked regions of the surface of the object, the method comprising the steps of:

pulse-modulating said high frequency electric fields by a signal of a frequency higher than 10 kHz; and introducing said pulse-modulated high frequency electric fields into a plasma generation chamber to produce said reaction gas plasmas.

One of the features of the invention is that, in pulse-modulating the high frequency electric fields, it is preferable that a pulse interval is shorter than about 10 micro-seconds. The term "pulse interval" herein used refers to the time period during which the introduction of microwaves is discontinued, as shown by "Y" in FIG. 4. The term "pulse width" used hereinafter refers to the time period during which the introduction of the microwaves is continued, as shown by "X" in FIG. 4.

According to the invention, by the introduction of microwaves which are pulse-modulated by a pulse signal of a frequency higher than 10 kHz, it is possible to control the radical production ratio in ECR plasmas, the ion temperature and the charge accumulation on the object, thereby enabling the etching performance at a high precision.

BRIEF DESCRIPTION OF THE DRAWINGS

The above and other objects, features and advantages of the present invention will be apparent from the following description of a preferred embodiment of the invention explained with reference to the accompanying drawings, in which:

FIG. 4 is a chart for explaining the relation between a pulse width and a pulse interval;

FIG. 5 is a block diagram for explaining a pulse modulator used in the embodiment according to the invention;

FIG. 10 is a graph for showing a micro-loading effect observed during the oxide film etching by plasmas under continuous discharges (CW) and pulse modulated plasmas (TM); and FIG. 11 is a graph for showing changes in polysilicon film etching rates and oxide film etching rates in relation to changes in pulse widths.

PREFERRED EMBODIMENT OF THE INVENTION

Now, a preferred embodiment according to the invention is explained hereunder with reference to the accompanying drawings.

Figure 1:
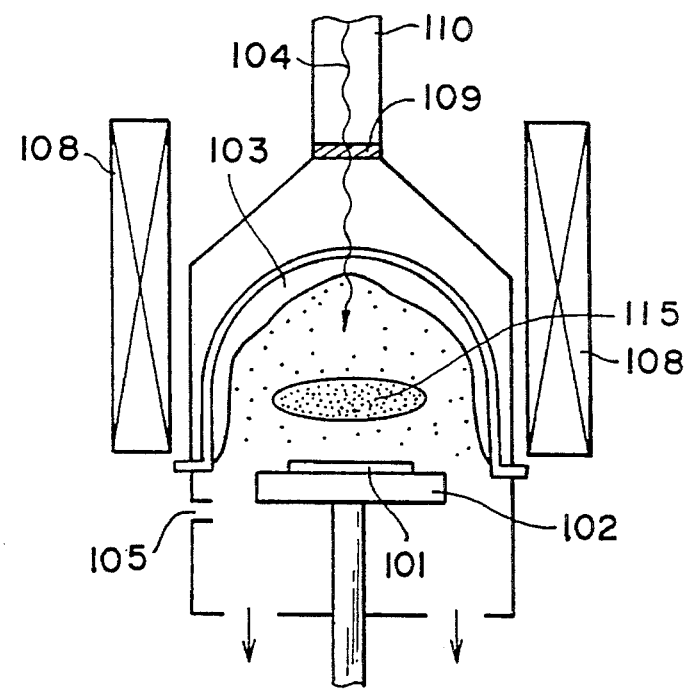
FIG. 1 is a diagram showing an example of a conventional microwave plasma-etching apparatus.
Figure 2:
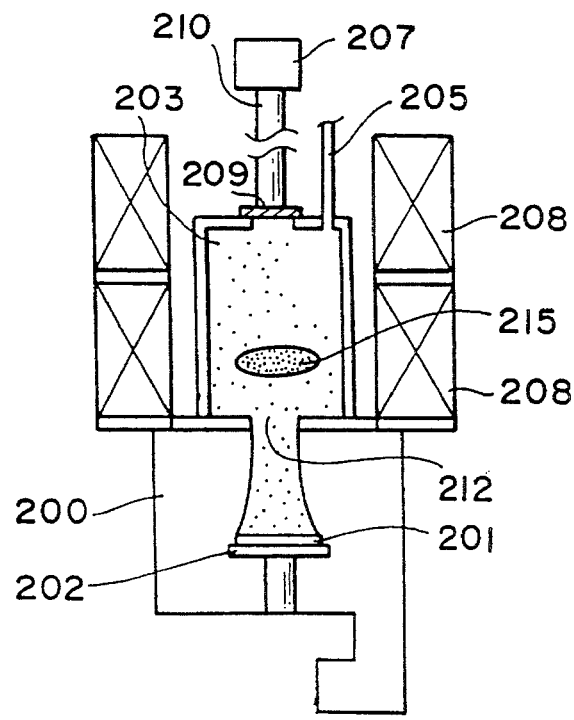
FIG. 2 is a diagram showing another example of a conventional microwave plasma-etching apparatus.
Figure 3:
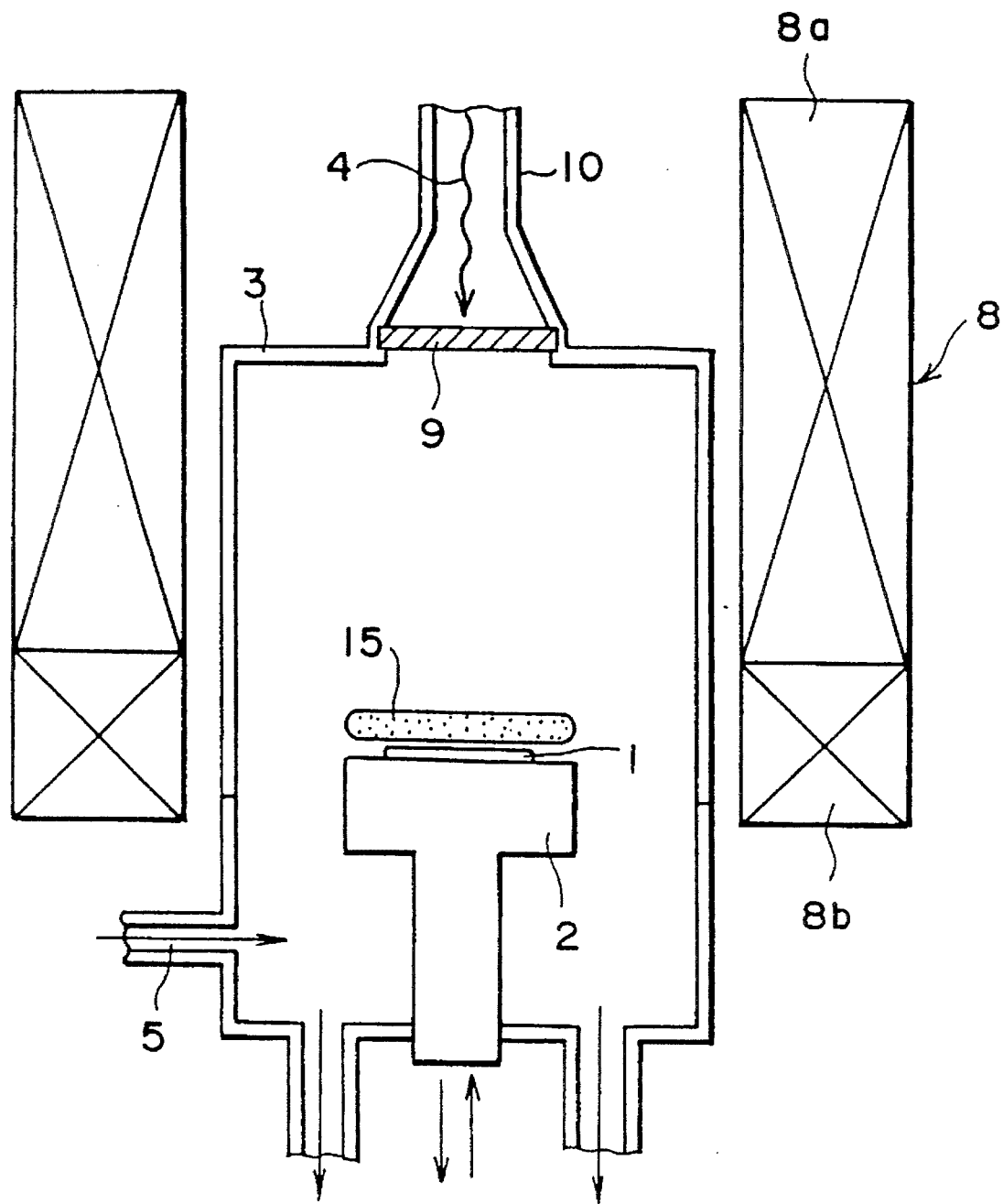
FIG. 3 is a diagram showing an ECR plasma-etching apparatus as an embodiment according to the invention.

FIG. 3 diagrammatically shows a plasma-etching apparatus as an embodiment according to the invention. The apparatus is constituted by a plasma generation chamber 3 for producing plasmas by electron cyclotron resonance (ECR) and a wafer transporting chamber (not shown) adjacent to the plasma generation chamber 3, for transporting wafers to the plasma generation chamber 3. An object 1 to be etched is placed on a table (wafer holder) 2 in the plasma generation chamber 3. A gas system 5 for introducing a reaction gas for plasmas is connected to tile plasma generation chamber 3. A microwave inlet window 9 in a dielectric material such as silica glass is provided at the top portion of the plasma generation chamber 3. Microwaves 4 from a microwave source (not shown) through a waveguide 10 are introduced into the plasma generation chamber 3 with the microwaves passing through the microwave inlet window 9. A klystron amplifier tube is employed as the microwave source because the klystron amplifier tube has little ripple components. In the drawings, reference numeral 8 represents a magnetic coil which is formed by a main-coil 8a and a sub-coil 8b, and reference numeral 15 represents an electron cyclotron resonance point.

FIG. 5 is a block diagram for showing how the modulated microwaves are produced in the embodiment according to the invention. Continuous microwaves 51 generated in and outputted from the klystron amplifier tube 50 are inputted to a modulator 53 to which pulse signals 52 generated by a function generator 54 are also applied. The modulator 53 outputs the modulated microwaves 55 wherein the continuous microwaves 51 are modulated by the pulse signals 52 from the function generator 54.

Figure 6:
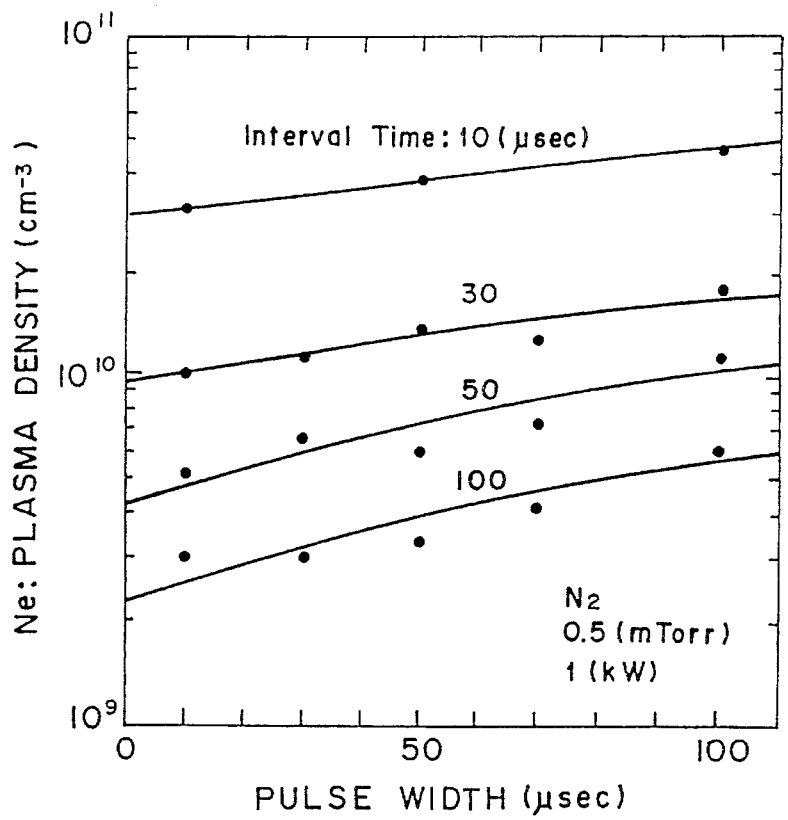
FIG. 6 is a graph for showing a change in plasma density in relation to changes in pulse widths and pulse intervals.

FIG. 6 graphically shows changes in plasma densities with changes in the pulse widths (microwaves being introduced) and the pulse intervals (microwaves not being introduced) with respect to $N_2$ plasmas. The plasma generation density is dependent on the pulse interval time and, at the pulse interval time in the order of 10 μs, it is possible to obtain the plasma density substantially the same as that obtained under the continuous discharges. Thus, for maintaining a practical etching rate, the pulse interval time shorter than about 10 μs is most appropriate.

Figure 7:
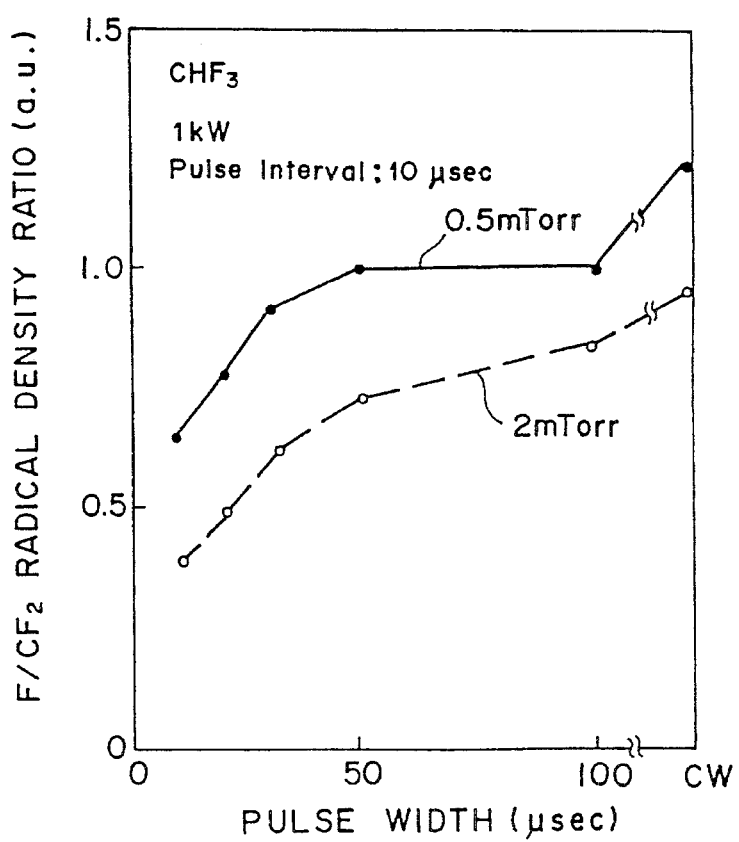
FIG. 7 is a graph for showing a change in $F/CF_2$ radical density in plasmas in relation to changes in pulse widths.

FIG. 7 graphically shows the changes in $CF_2$ and F radical density in $CHF_3$ plasmas which take place when the pulse widths are changed. It is noted that the $CF_2$ radical density in the plasmas rises when the pulse width is reduced to smaller than about 10 μs. This means that the dissociation reaction is progressing in the order of microseconds in the $CHF_3$ plasmas. Thus, only by the pulse-modulation in the order of micro-seconds, is it made possible to control the radical density ratio in the plasmas. The $CHF_3$ gas plasmas are used for etching silicon oxide film and, since the $CF_2$ radical is a precursor of the polymer film that is deposited on underlying silicon, the control of the $CF_2$ radical density is important for controlling the oxide film etching selectivity with respect to the underlying silicon.

Figure 8:
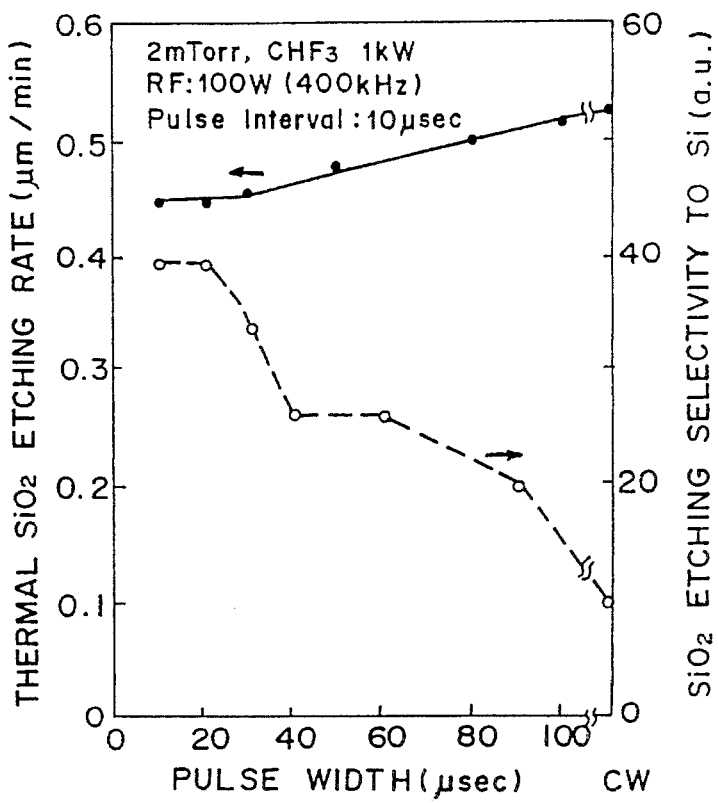
FIG. 8 is a graph for showing a change in oxide film etching rate and oxide film etching selectivity to underlying silicon in relation to changes in pulse widths.

FIG. 8 graphically shows the relation of the pulse widths with respect to the oxide film etching rate and the selectivity thereof to the underlying silicon. It is noted that the $CF_2$ radical increases as the pulse width becomes smaller, whereby the etching selectivity is significantly improved.

Figure 9:
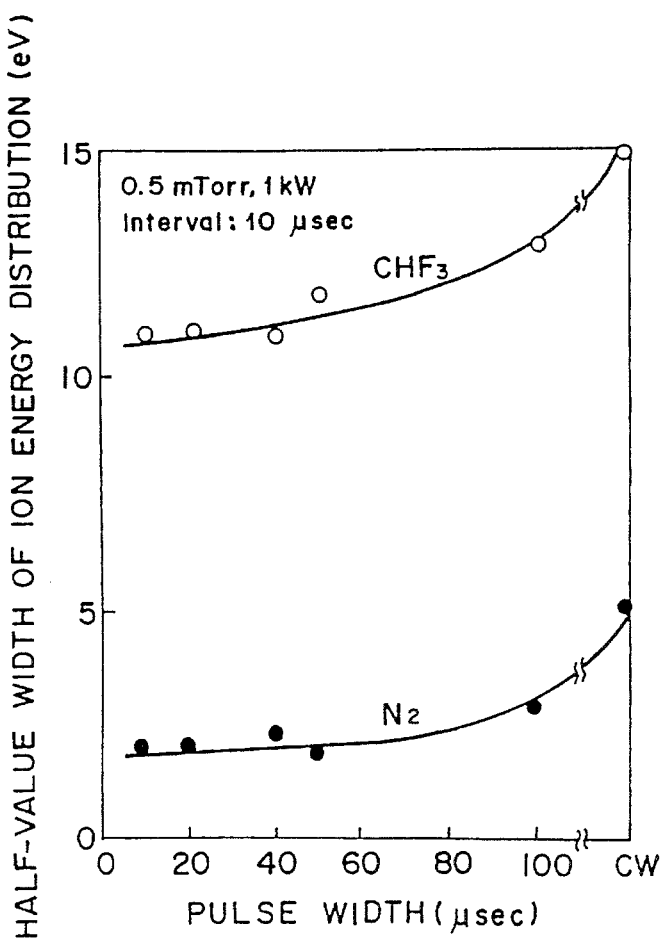
FIG. 9 is a graph for showing a change in a half-value width of ion energy distribution in relation to changes in pulse widths.

FIG. 9 graphically shows the changes, which develop when the pulse width is changed, in a half-value width of ion energy distribution in $CHF_3$ plasmas and $N_2$ plasmas. As the pulse width is reduced, the half-value width becomes smaller. This means that the ion temperature Is lowered in the pulse-modulated plasma as compared with that under the continuous discharges. Especially, where the pulse interval time is fixed to 10 μs, it is noted that the ion temperature falls when the pulse width becomes smaller than about 90 μs. The reason for this is that, since the frequency of the drift waves generated in the fluorocarbon plasma is about 10 kHz, the pulse-modulation by a frequency higher than the above frequency suppresses the generation of drift waves. If the drift waves were generated, the ion temperature would rise due to plasma vibrations and deteriorate the moving directions of the ions to impinge on the wafer.

FIG. 10 graphically shows the micro-loading effect observed during the oxide film etching under the continuous discharges (CW) and the pulse-modulated discharges (TM) of 10 μs/10 μs. It is noted that use of the pulse-modulated plasma of 50 kHz has enabled to suppress the micro-loading effect during the etching of a contact hole having a high aspect ratio.

FIG. 11 graphically shows the changes in the polysilicon and underlying gate oxide film etching rates which develop as the pulse widths are changed during the etching of gate electrode materials. It is noted that, as the pulse width is reduced, the etching rate of the gate oxide film is lowered so that the polysilicon etching selectivity with respect to the oxide film is greatly increased as compared with that under the continuous discharges. It is considered that this can be explained from the reactivity differences between the silicon and the oxide film with respect to chlorine ion and also that this is due to the lowering of the etching rates in the oxide film reacted with the chlorine by ion bombardment in the pulse interval.

Also, since the time for accumulation of charges in a wafer is on the order of milli-seconds, the accumulation of charges to the wafer is suppressed by the pulse-modulated plasma on the order of micro-seconds, and this enables the suppression of damage to the device caused by the charge accumulation and of notches caused during the electrode etching process.

Thus, the use of the pulse-modulated plasma in the order of micro-seconds greatly improves the plasma etching by overcoming the problems existing in the prior art.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A plasma-etching method for etching a surface of an object by directing reaction gas plasmas excited by high frequency electric fields to impinge on the object thereby to impact nonmasked regions of the surface of the object, the method comprising the steps of:

pulse-modulating said high frequency electric fields by a signal of a frequency higher than 10 kHz; and introducing said pulse-modulated high frequency electric fields into a plasma generation chamber to produce said reaction gas plasmas.

2. The plasma-etching method according to claim 1, in which said step for pulse-modulating said high frequency electric fields is performed with a pulse interval time shorter than about 10 µs.

3. A plasma-etching method for etching a surface of an object by directing reaction gas plasmas excited by high frequency electric fields to impinge on the object thereby to impact nonmasked regions of the surface of the object, the method comprising the steps of:

pulse-modulating said high frequency electric fields by a signal of a frequency higher than 10 kHz; and introducing said pulse-modulated high frequency electric fields into a plasma generation chamber to produce said reaction gas plasmas;

wherein said signal is a microwave signal that is pulsed such that between pulses the introduction of microwaves is discontinued.

4. A plasma-etching apparatus of an electron cyclotron resonance type, the apparatus comprising:

a plasma generation chamber to which an etching gas is introduced;

a microwave introducing means for introducing high frequency electric fields into said plasma producing chamber;

a wafer holder which holds an object to be etched in said plasma generation chamber; and a pulse-modulating means for modulating said high frequency electric fields by a signal of a frequency higher than about 10 kHz.

5. The plasma-etching apparatus according to claim 4, in which said pulse-modulating means is configured to operate with a pulse interval time shorter than about 10 µs.

* * * * *